(12) United States Patent
Tonegawa

(10) Patent No.: US 11,600,646 B2
(45) Date of Patent: Mar. 7, 2023

(54) SEMICONDUCTOR ELEMENT AND METHOD OF MANUFACTURING SEMICONDUCTOR ELEMENT

(71) Applicant: SONY SEMICONDUCTOR SOLUTIONS CORPORATION, Atsugi (JP)

(72) Inventor: Susumu Tonegawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 56 days.

(21) Appl. No.: 17/250,374

(22) PCT Filed: Jul. 12, 2019

(86) PCT No.: PCT/JP2019/027633
§ 371 (c)(1),
(2) Date: Jan. 13, 2021

(87) PCT Pub. No.: WO2020/022098
PCT Pub. Date: Jan. 30, 2020

(65) Prior Publication Data
US 2021/0327933 A1 Oct. 21, 2021

(30) Foreign Application Priority Data
Jul. 24, 2018 (JP) .............................. JP2018-138144

(51) Int. Cl.
*H01L 27/146* (2006.01)
*H01L 29/06* (2006.01)
*H01L 29/10* (2006.01)

(52) U.S. Cl.
CPC .. *H01L 27/14616* (2013.01); *H01L 27/14603* (2013.01); *H01L 27/14614* (2013.01);
(Continued)

(58) Field of Classification Search
CPC .......... H01L 27/14614; H01L 29/0642; H01L 27/14603; H01L 27/14643; H01L 27/14689; H01L 29/1033; H01L 27/14616
See application file for complete search history.

(56) References Cited

U.S. PATENT DOCUMENTS 6,204,542 B1 3/2001 Kinoshita et al.
7,927,902 B2 * 4/2011 Park ................... H01L 27/14603
438/48
(Continued)

FOREIGN PATENT DOCUMENTS

CN 101320744 A 12/2008
CN 101452942 A 6/2009
(Continued)

OTHER PUBLICATIONS

International Preliminary Report on Patentability of PCT Application No. PCT/JP2019/027633, dated Jan. 26, 2021, 09 pages of English Translation and 05 pages of IPRP.
(Continued)

*Primary Examiner* — Wasiul Haider
(74) *Attorney, Agent, or Firm* — Chip Law Group

(57) ABSTRACT

Current concentration in a channel region is reduced in a case where diffusion occurs of impurities from an element isolation region. A semiconductor element includes the element isolation region formed on a semiconductor substrate, a source region, a drain region, a gate, and the channel region. The gate is arranged on a surface of the semiconductor substrate between the source region and the drain region with an insulating film interposed between the gate and the semiconductor substrate. The channel region is arranged directly below the gate and between the source region and the drain region and is arranged adjacent to the element isolation region, and has a shape in which a channel
(Continued)

length that is a distance between the drain region and the source region is shortened in the vicinity of the element isolation region.

9 Claims, 11 Drawing Sheets

(52) U.S. Cl.
CPC .. *H01L 27/14643* (2013.01); *H01L 27/14689* (2013.01); *H01L 29/0638* (2013.01); *H01L 29/0642* (2013.01); *H01L 29/1033* (2013.01)

(56) References Cited

U.S. PATENT DOCUMENTS

| | | | |
|---|---|---|---|
| 2008/0296645 A1 | 12/2008 | Itonaga | |
| 2009/0140304 A1* | 6/2009 | Kudoh | H04N 5/3745 257/292 |
| 2010/0167448 A1 | 7/2010 | Itonaga | |
| 2010/0214459 A1 | 8/2010 | Kudoh | |
| 2011/0063470 A1 | 3/2011 | Kudoh | |
| 2012/0049254 A1 | 3/2012 | Itonaga | |
| 2013/0049084 A1* | 2/2013 | Saka | H01L 27/14616 438/282 |
| 2014/0239152 A1* | 8/2014 | Chen | H01L 27/14641 250/208.1 |
| 2016/0260766 A1 | 9/2016 | Itonaga | |
| 2017/0271393 A1 | 9/2017 | Itonaga | |
| 2017/0365631 A1* | 12/2017 | Iizuka | H01L 27/14687 |

FOREIGN PATENT DOCUMENTS

| | | |
|---|---|---|
| CN | 102201423 A | 9/2011 |
| CN | 102956657 A | 3/2013 |
| DE | 202008018642 U1 | 3/2017 |
| EP | 2065938 A2 | 6/2009 |
| EP | 2246887 A2 | 11/2010 |
| EP | 3151280 A1 | 4/2017 |
| JP | 2008-147693 A | 6/2008 |
| JP | 2009-016810 A | 1/2009 |
| JP | 2009-135319 A | 6/2009 |
| JP | 2011-103054 A | 5/2011 |
| JP | 2013-045879 A | 3/2013 |
| JP | 2014-045219 A | 3/2014 |
| KR | 10-2008-0106846 A | 12/2008 |
| KR | 10-2009-0056846 A | 6/2009 |
| KR | 10-2014-0099848 A | 8/2014 |
| TW | 200903793 A | 1/2009 |
| TW | 200939462 A | 9/2009 |

OTHER PUBLICATIONS

International Search Report and Written Opinion of PCT Application No. PCT/JP2019/027633, dated Oct. 8, 2019, 10 pages of ISRWO.

* cited by examiner

SEMICONDUCTOR ELEMENT AND METHOD OF MANUFACTURING SEMICONDUCTOR ELEMENT

CROSS REFERENCE TO RELATED APPLICATIONS

This application is a U.S. National Phase of International Patent Application No. PCT/JP2019/027633 filed on Jul. 12, 2019, which claims priority benefit of Japanese Patent Application No. JP 2018-138144 filed in the Japan Patent Office on Jul. 24, 2018. Each of the above-referenced applications is hereby incorporated herein by reference in its entirety.

TECHNICAL FIELD

The present disclosure relates to a semiconductor element and a method of manufacturing a semiconductor element. More specifically, the present disclosure relates to a semiconductor element formed adjacent to an element isolation region and a method of manufacturing the semiconductor element.

BACKGROUND ART

In semiconductor elements used in imaging elements and the like, miniaturization has been progressed as the scale of the imaging elements and the like increases. Specifically, a semiconductor element has been devised that is miniaturized by using shallow trench isolation (STI) instead of the conventionally used local oxidation of silicon (LOCOS) as an isolation region that electrically isolates semiconductor elements from each other. For example, a semiconductor device has been devised in which an element isolation region is formed by using the STI method, and then an impurity concentration on a source region side is configured to have a higher concentration profile than that in a drain region side during formation of a channel region of a transistor (see, for example, Patent Document 1). With this concentration profile, it is possible to form a transistor adaptable to different power supply voltages by reducing a current generated by impact ionization when drain bias is applied to reduce degradation of characteristics caused by hot carriers.

CITATION LIST

Patent Document

Patent Document 1: Japanese Patent Application Laid-Open No. 2008-147693

SUMMARY OF THE INVENTION

Problems to be Solved by the Invention

Since the STI described above has a structure in which an insulator is embedded in a trench formed in a semiconductor substrate, microfabrication is possible, but on the other hand, there are problems such as occurrence of a crystal defect and generation of a dark current from the STI interface due to a difference in the thermal expansion coefficient between the semiconductor substrate and the STI. Thus, a method has been studied of forming the element isolation region by a semiconductor region heavily doped with impurities. However, in a case where the element isolation region based on such a semiconductor region is adopted, a problem occurs that the impurities are diffused into an element region in a subsequent semiconductor element forming step. For example, in the conventional technology described above, if the element isolation region based on the semiconductor region is used instead of the STI, there is a problem that the impurities from the element isolation region diffuse into the channel region and the effective channel region becomes narrower. As a result of the narrowing of the channel region, current density in a central portion of the channel is increased, and capture and emission of electrons that are carriers occur in the region, whereby a problem occurs such as increase of noise due to hindrance to movement of the carriers.

The present disclosure has been made in view of the problems described above, and it is intended to reduce current concentration in the channel region and reduce noise even in a case where diffusion occurs of the impurities from the element isolation region.

Solutions to Problems

The present disclosure has been made to solve the problems described above, and a first aspect of the present disclosure is a semiconductor element including: an element isolation region formed on a semiconductor substrate; a source region; a drain region; a gate arranged on a surface of the semiconductor substrate between the source region and the drain region with an insulating film interposed between the gate and the semiconductor substrate; and a channel region that is arranged directly below the gate and between the source region and the drain region and is arranged adjacent to the element isolation region, and has a shape in which a channel length that is a distance between the drain region and the source region is shortened in the vicinity of the element isolation region.

Furthermore, in the first aspect, the channel region may have a shape in which an interface with the drain region protrudes in a direction of the source region, in the vicinity of the element isolation region.

Furthermore, in the first aspect, in the gate, an end face in the vicinity of the drain may have a shape substantially identical to a shape of the interface between the channel region and the drain region.

Furthermore, in the first aspect, in the channel region, an interface with the source region may have a shape of a plane perpendicular to a direction of the drain region.

Furthermore, in the first aspect, the drain region may be formed by being doped with an impurity with the gate as a mask, the gate having a shape in which a boundary with the drain region protrudes in the direction of the source region, in the vicinity of the element isolation region.

Furthermore, in the first aspect, the drain region may be formed by being doped with an impurity with a resist as a mask, the resist having a shape in which a boundary with the drain region protrudes in the direction of the source region, in the vicinity of the element isolation region.

Furthermore, in the first aspect, the element isolation region may include a semiconductor region of a conductivity type different from a conductivity type of the channel region.

Furthermore, in the first aspect, the channel region may include a semiconductor region of a conductivity type identical to a conductivity type of the source region and the drain region.

Furthermore, in the first aspect, the drain region may be formed by being doped with any of phosphorus, arsenic, antimony, indium or germanium, as an impurity.

Furthermore, a second aspect of the present disclosure is a method of manufacturing a semiconductor element, including: an element isolation region forming step of forming an element isolation region formed on a semiconductor substrate; a source and drain forming step of forming a source region and a drain region; a gate forming step of forming a gate arranged on a surface of the semiconductor substrate between the source region and the drain region with an insulating film interposed between the gate and the semiconductor substrate; and a channel forming step of forming a channel region that is arranged directly below the gate and between the source region and the drain region and is arranged adjacent to the element isolation region, and has a shape in which an interface with the drain region protrudes in a direction of the source region, in the vicinity of the element isolation region.

According to the aspects described above, an effect is obtained that the channel length in the vicinity of the element isolation region in the channel region is shortened. It is expected that a channel resistance is reduced in the vicinity of the element isolation region in the channel region.

Effects of the Invention

According to the present disclosure, an excellent effect is obtained that the current concentration in the channel region is reduced even in a case where the diffusion occurs of the impurities from the element isolation region.

MODE FOR CARRYING OUT THE INVENTION

Figure 1:
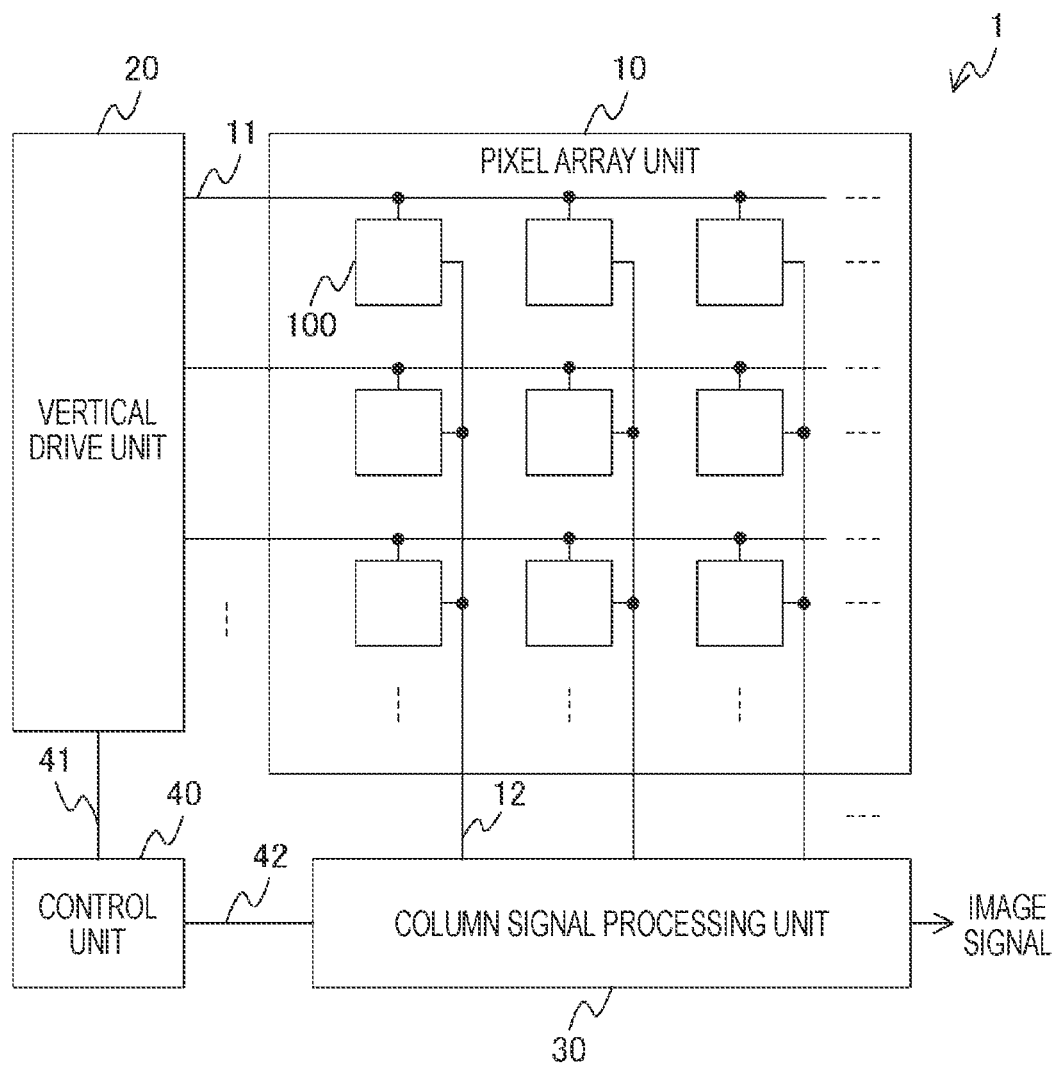
FIG. 1 is a diagram illustrating a configuration example of an imaging element according to an embodiment of the present disclosure.

Next, a mode for carrying out the present disclosure (hereinafter, referred to as an embodiment) will be described with reference to the drawings. In the drawings below, the same or similar portions are denoted by the same or similar reference numerals. However, the drawings are schematic, and dimensional ratios and the like of respective portions do not always match actual ones. Furthermore, it goes without saying that portions are included where dimensional relationships and ratios are different between the drawings. Furthermore, embodiments will be described in the following order.

1. Configuration of semiconductor element
2. Method of manufacturing semiconductor element <1. Configuration of Semiconductor Element>

[Configuration of Imaging Element]

FIG. 1 is a diagram illustrating a configuration example of an imaging element according to an embodiment of the present disclosure. A semiconductor element of the present disclosure will be described by taking an imaging element 1 in the figure as an example. The imaging element 1 illustrated in the figure includes a pixel array unit 10, a vertical drive unit 20, a column signal processing unit 30, and a control unit 40.

The pixel array unit 10 includes pixels 100 arranged in a two-dimensional lattice. Here, each pixel 100 generates an image signal depending on light emitted thereto. The pixel 100 includes a photoelectric conversion unit that generates electric charges depending on the light emitted thereto. Furthermore, the pixel 100 further includes a pixel circuit. The pixel circuit generates the image signal based on the electric charges generated by the photoelectric conversion unit. The generation of the image signal is controlled by a control signal generated by the vertical drive unit 20 described later. In the pixel array unit 10, signal lines 11 and 12 are arranged in an XY matrix. The signal line 11 is a signal line that transmits the control signal for the pixel circuit in the pixel 100, is arranged for each row of the pixel array unit 10, and is commonly wired to the pixels 100 arranged in each row. The signal line 12 is a signal line that transmits the image signal generated by the pixel circuit of the pixel 100, is arranged for each column of the pixel array unit 10, and is commonly wired to the pixels 100 arranged in each column. These photoelectric conversion unit and pixel circuit are formed on a semiconductor substrate.

The vertical drive unit 20 generates the control signal for the pixel circuit of the pixel 100. The vertical drive unit 20 transmits the control signal generated to the pixel 100 via the signal line 11 in the figure. The column signal processing unit 30 processes the image signal generated by the pixel 100. The column signal processing unit 30 processes the image signal transmitted from the pixel 100 via the signal line 12 in the figure. The processing in the column signal processing unit 30 corresponds to, for example, analog-to-digital conversion for converting an analog image signal generated in the pixel 100 into a digital image signal. The image signal processed by the column signal processing unit 30 is output as an image signal of the imaging element 1.

The control unit 40 controls the entire imaging element 1. The control unit 40 controls the imaging element 1 by generating and outputting control signals for controlling the vertical drive unit 20 and the column signal processing unit 30. The control signals generated by the control unit 40 are transmitted to the vertical drive unit 20 and the column signal processing unit 30 via signal lines 41 and 42, respectively.

[Configuration of Pixel]

Figure 2:
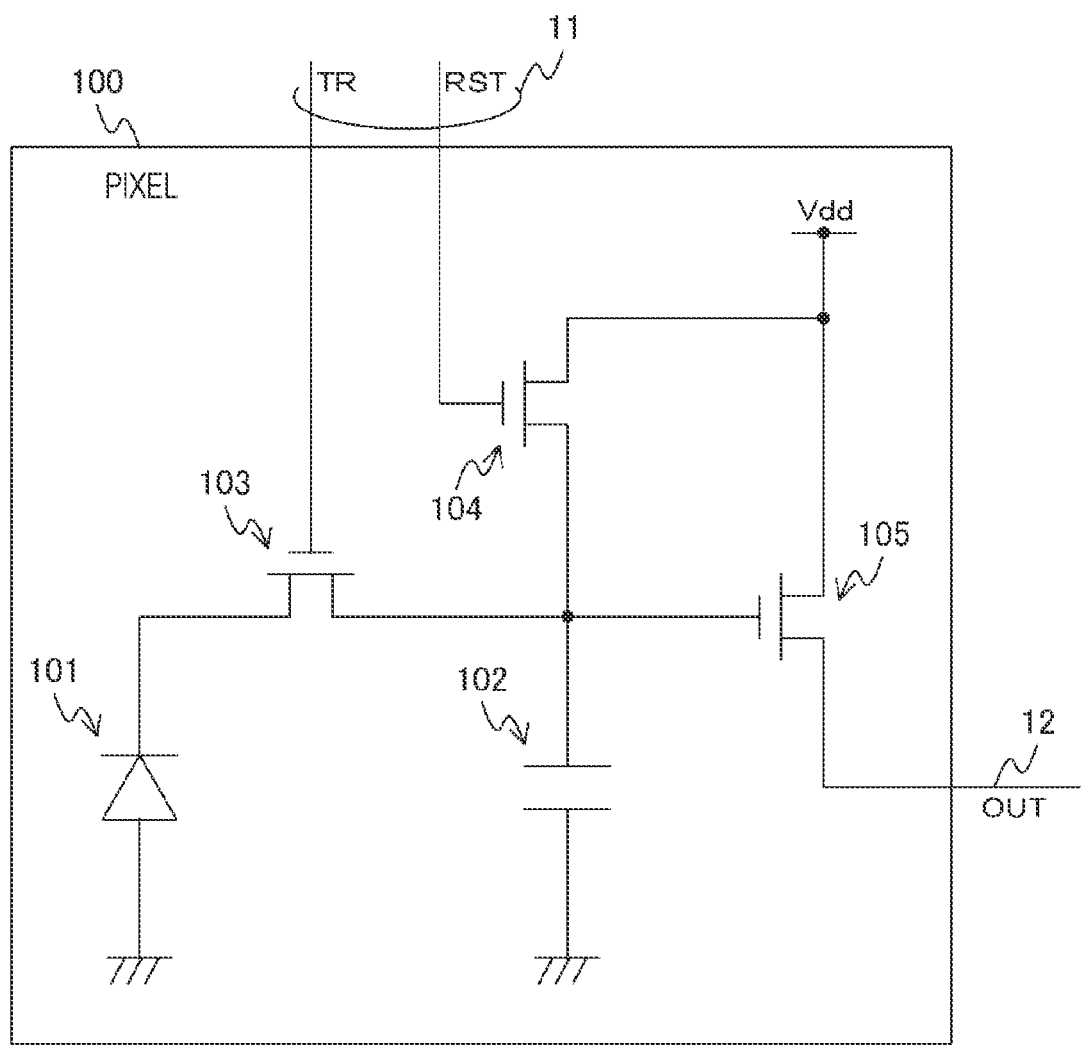
FIG. 2 is a diagram illustrating a configuration example of a pixel according to the embodiment of the present disclosure.

FIG. 2 is a diagram illustrating a configuration example of the pixel according to the embodiment of the present disclosure. The figure is a circuit diagram illustrating a configuration example of the pixel 100. The pixel 100 in the figure includes a photoelectric conversion unit 101, a charge holding unit 102, and MOS transistors 103 to 105.

The anode of the photoelectric conversion unit 101 is grounded, and the cathode is connected to the source of the MOS transistor 103. The drain of the MOS transistor 103 is connected to the source of the MOS transistor 104, the gate of the MOS transistor 105, and one end of the charge holding unit 102. The other end of the charge holding unit 102 is grounded. The drains of the MOS transistors 104 and 105 are commonly connected to a power supply line Vdd, and the source of the MOS transistor 105 is connected to an output signal line OUT. The gates of the MOS transistors 103 and 104 are connected to a transfer signal line TR and a reset signal line RST, respectively. Note that, the transfer signal line TR and the reset signal line RST constitutes the signal line 11, and the output signal line OUT constitutes the signal line 12.

The photoelectric conversion unit 101 generates the electric charges depending on the light with which the pixel 100 is irradiated, as described above. For the photoelectric conversion unit 101, a photodiode can be used. Furthermore, the charge holding unit 102 and the MOS transistors 103 to 105 constitute a pixel circuit.

The MOS transistor 103 is a transistor that transfers the electric charges generated by the photoelectric conversion of the photoelectric conversion unit 101 to the charge holding unit 102. The transfer of the electric charges in the MOS transistor 103 is controlled by a signal transmitted by the transfer signal line TR. The charge holding unit 102 is a capacitor that holds the electric charges transferred by the MOS transistor 103. The MOS transistor 105 is a transistor that generates a signal based on the electric charges held by the charge holding unit 102 and outputs the signal as an image signal to the signal line 12.

The MOS transistor 104 is a transistor that resets the charge holding unit 102 by discharging the electric charges held in the charge holding unit 102 to the power supply line Vdd. The reset by the MOS transistor 104 is controlled by a signal transmitted by the reset signal line RST, and is executed before the transfer of the electric charges by the MOS transistor 103. Note that, at the time of the reset, the photoelectric conversion unit 101 can also be reset by causing the MOS transistor 103 to be conductive. As described above, the pixel circuit converts the electric charges generated by the photoelectric conversion unit 101 into the image signal.

[Arrangement of Pixel]

Figure 3:
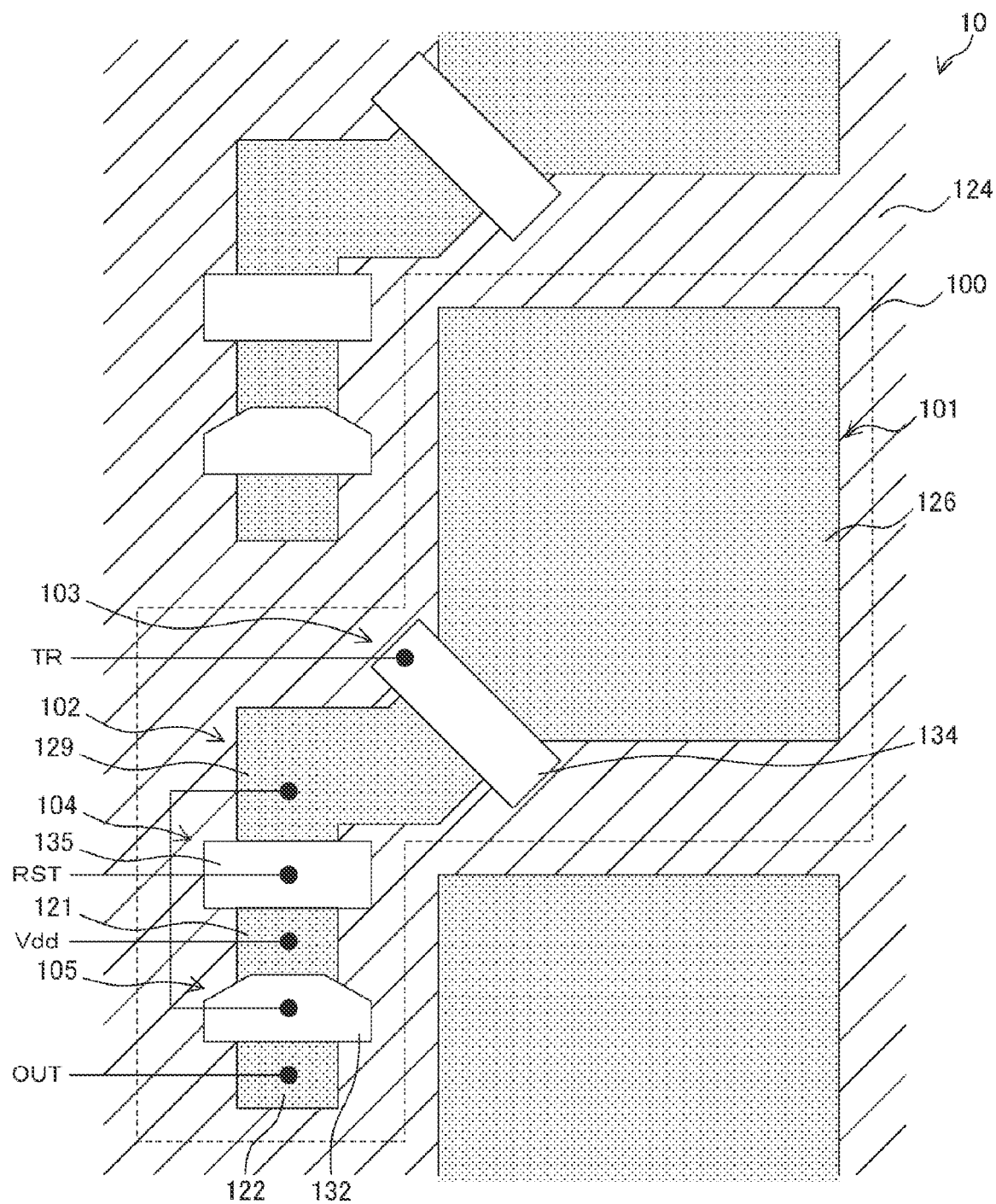
FIG. 3 is a diagram illustrating an arrangement example of the pixel according to the embodiment of the present disclosure.

FIG. 3 is a diagram illustrating an arrangement example of the pixel according to the embodiment of the present disclosure. The figure is a plan view illustrating an arrangement example in the semiconductor substrate of the pixel 100 described in FIG. 2. In the figure, hatched polygons represent semiconductor regions of elements formed in a diffusion layer of the semiconductor substrate, and white polygons represent the gates of MOS transistors. These elements are isolated by an element isolation region 124 (area hatched by oblique lines in the figure). In the pixel 100 of the figure, an n-type semiconductor region 126 of the photoelectric conversion unit 101 is arranged on the upper right. Furthermore, a gate 134 and a drain region 129 of the MOS transistor 103 are arranged adjacent to the lower left of the photoelectric conversion unit 101. Note that, the n-type semiconductor region 126 of the photoelectric conversion unit 101 also corresponds to a source region of the MOS transistor 103. Furthermore, the drain region 129 of the MOS transistor 103 constitutes a floating diffusion region (floating diffusion) and corresponds to the charge holding 102.

A gate 135 and a drain region 121 of the MOS transistor 104 are arranged adjacent to the MOS transistor 103. Note that, the drain region 129 of the MOS transistor 103 corresponds to a source region of the MOS transistor 104. A gate 132 and a source region 122 of the MOS transistor 105 are arranged adjacent to the MOS transistor 104. Note that, here, the drain region 121 of the MOS transistor 104 also corresponds to a drain region of the MOS transistor 105. The signal lines TR and RST are connected to the gates 134 and 135, respectively, and the gate 105 is connected to the drain region 129 of the MOS transistor 103.

[Configuration of Transistor]

Figure 4:
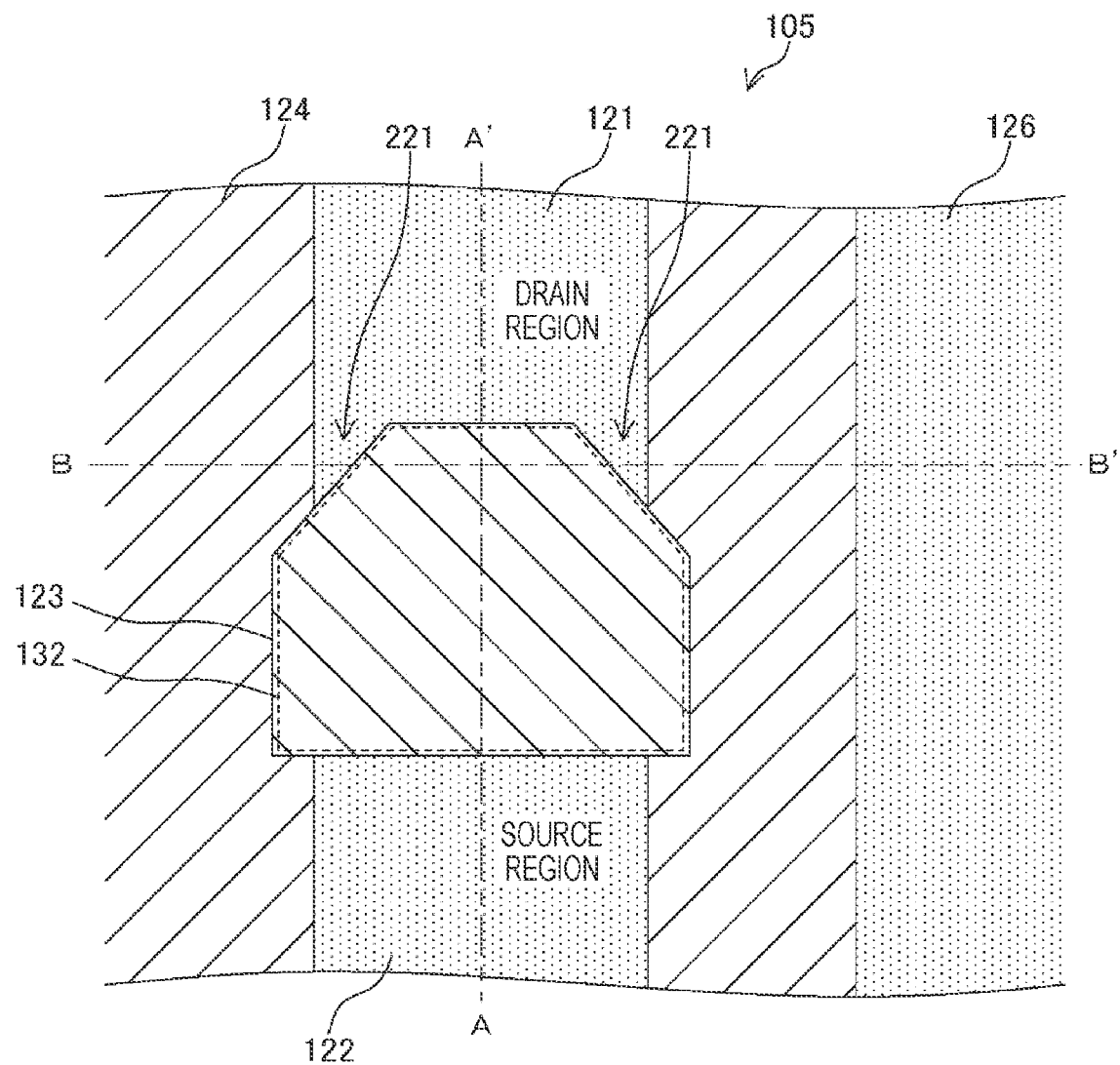
FIG. 4 is a plan view illustrating a configuration example of a transistor according to the embodiment of the present disclosure.

FIG. 4 is a plan view illustrating a configuration example of the transistor according to the embodiment of the present disclosure. The figure is a plan view illustrating a configuration example of the MOS transistor 105 described in FIG. 3. The transistor according to the present disclosure will be described by taking the MOS transistor 105 in the figure as an example. The MOS transistor 105 includes the gate 132, the drain region 121, the source region 122, and a channel region 123. Note that, the dotted line in the figure represents the gate 132. The MOS transistor 105 is formed on the semiconductor substrate and is formed between the element isolation regions 124. The channel region 123 having substantially the same shape as that of the gate 132 is formed on a semiconductor substrate surface directly below the gate 132. Carriers in the source region 122 move through the channel region 123 to the drain region 121. A distance between the source region 122 and the drain region 121 in a direction along the movement of the carriers is referred to as a channel length.

As illustrated in the figure, the channel lengths are different lengths in a region adjacent to the element isolation region 124 and a central portion of the channel region 123. A boundary between the channel region 123 and the source region 122 has a shape of a plane perpendicular to the channel length. On the other hand, a boundary between the channel region 123 and the drain region 121 has a shape in which the drain region 121 protrudes in a direction of the source region 122. A protruding portion 221 that is this protruding region is formed in the vicinity of a boundary with the element isolation region 124. By shortening the channel length at an end of the channel region 123 in this way, the current concentration in the channel region 123 can be relaxed.

Figure 5:
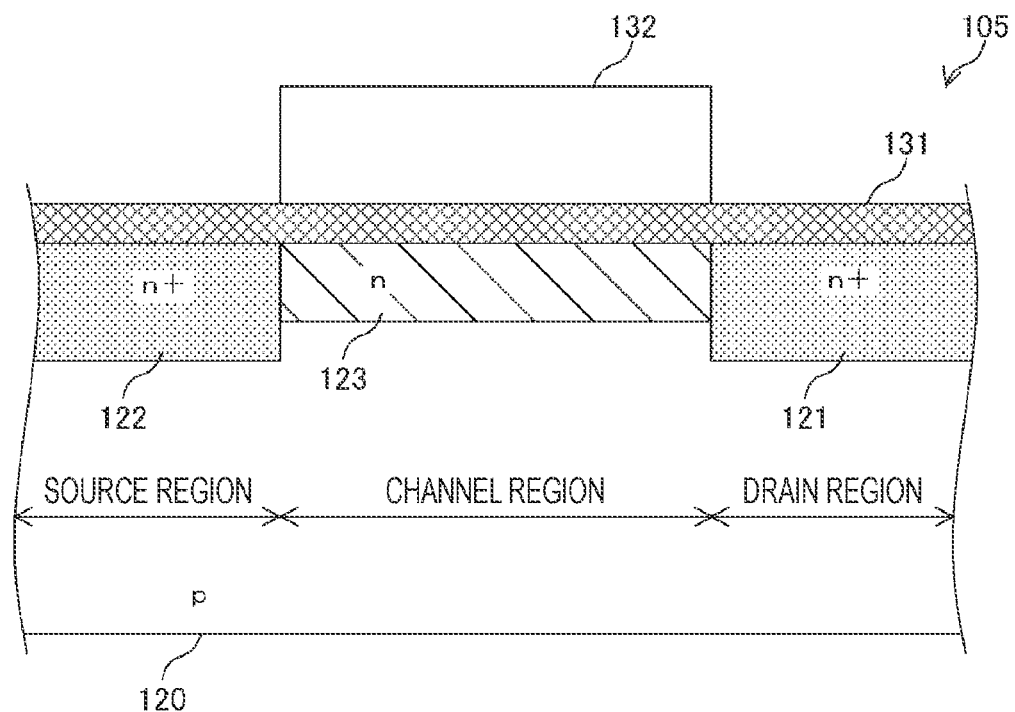
FIG. 5 is a cross-sectional view illustrating the configuration example of the transistor according to the embodiment of the present disclosure.

FIG. 5 is a cross-sectional view illustrating the configuration example of the transistor according to the embodiment of the present disclosure. The figure is a schematic diagram illustrating a configuration example of a cross section of the MOS transistor 105 along a line A-A' in FIG. 4. The MOS transistor 105 is formed in a p-type well region formed on a semiconductor substrate 120 such as silicon. For convenience, the semiconductor substrate 120 is assumed to constitute the p-type well region. On a surface of the semiconductor substrate 120, n-type semiconductor regions are formed respectively constituting the source region 122, the channel region 123, and the drain region 121. These n-type semiconductor regions can be formed by doping the p-type well region with any of phosphorus, arsenic, antimony, indium, or germanium that is a donor impurity. In the MOS transistor 105 in the figure, phosphorus is assumed as the donor impurity for doping. An insulating film 131 is arranged on the surface of the semiconductor substrate 120. The insulating film 131 can include, for example, silicon oxide ($SiO_2$). The gate 132 is arranged directly above the channel region 123 with the insulating film 131 interposed between the gate 132 and the channel region 123. The gate 132 can include, for example, polycrystalline silicon.

Figure 6:
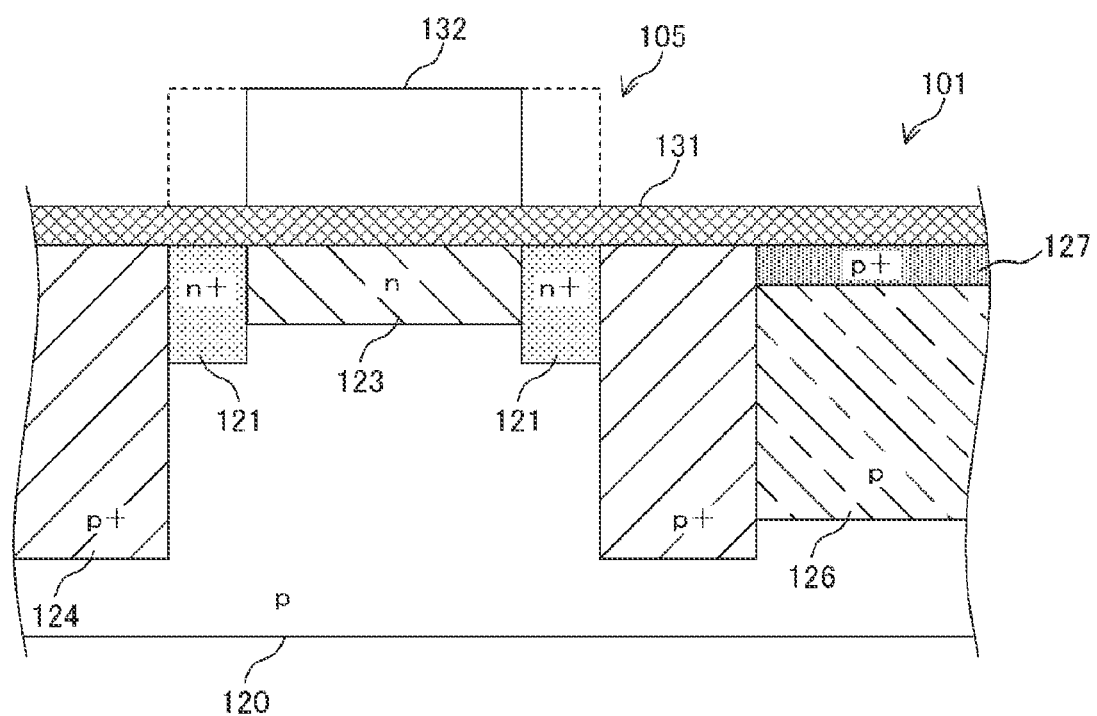
FIG. 6 is a cross-sectional view illustrating the configuration example of the transistor according to the embodiment of the present disclosure.

FIG. 6 is a cross-sectional view illustrating the configuration example of the transistor according to the embodiment of the present disclosure. The figure is a schematic diagram illustrating a configuration example of a cross section of the MOS transistor 105 along a line B-B' in FIG. 4. On both sides of the channel region 123 in the figure, n-type semiconductor regions of the drain region 121 corresponding to the protruding portion 221 described in FIG. 5 are arranged. The element isolation region 124 is arranged outside these. As described above, in the MOS transistor 105, an interface between the channel region 123 and the drain region 121 has a shape protruding in the direction of the source region 122 in the vicinity of the element isolation region 124.

The element isolation region 124 can be formed by doping the p-type well region with boron that is an acceptor impurity. The n-type semiconductor region 126 of the photoelectric conversion unit 101 is arranged adjacent to the element isolation region 124. A photodiode is constituted by a pn junction between the n-type semiconductor region 126 and the p-type well region adjacent to the n-type semiconductor region 126. Note that, a p-type semiconductor region 127 is arranged on a surface of the n-type semiconductor region 126. The p-type semiconductor region 127 reduces generation of a dark current by pinning the surface of the n-type semiconductor region 126.

[Impurity Concentration]

Figure 7:
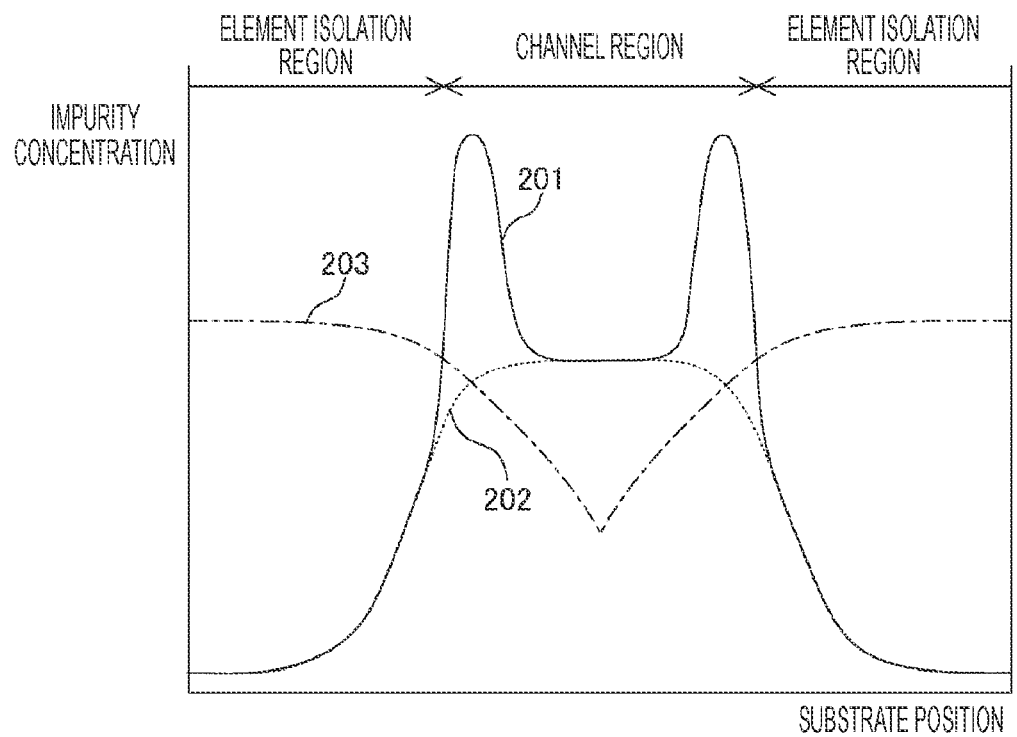
FIG. 7 is a diagram illustrating an example of an impurity concentration of the transistor according to the embodiment of the present disclosure.

FIG. 7 is a diagram illustrating an example of an impurity concentration of the transistor according to the embodiment of the present disclosure. The figure is a diagram illustrating a profile of an impurity concentration in the cross section of the MOS transistor 105 along the line B-B' in FIG. 4. A solid line graph 201 in the figure is a graph illustrating a concentration of phosphorus that is an impurity, and a one-dot chain line graph 203 is a graph illustrating a concentration of boron that is an impurity. Note that, a broken line graph 202 is a graph illustrating a concentration of phosphorus in a case where the protruding portion 221 of the drain region 121 described in FIG. 4 is not formed.

The channel region 123, whose impurity concentration is adjusted depending on a threshold value of the MOS transistor, has a relatively low impurity concentration. The graph 202 corresponds to the impurity concentration at this time. On the other hand, the drain region 121 has a relatively high impurity concentration to make ohmic contact with a wiring line. Since the protruding portion 221 described in FIG. 4 is arranged in the vicinity of the element isolation region of the channel region, a protrusion is generated in the impurity concentration profile as illustrated in the graph 201.

As described above, the element isolation region 124 is doped with boron to form a p-type. The element isolation region 124 is formed in a conductivity type different from that of the drain region 121, the source region 122, and the channel region 123, and has a relatively high impurity concentration, whereby a depletion layer is formed between the element isolation region 124 and the channel region 123 and the like, and isolation is made. As will be described later, the MOS transistor 105 is formed after the element isolation region 124 is formed. In a process of forming the MOS transistor 105, boron that is an impurity with which the element isolation region 124 is doped diffuses into the channel region 123. As a result of this diffusion, as illustrated in the graph 203 in the figure, a high concentration of boron is present in the channel region 123 in the vicinity of the element isolation region 124.

By application of a voltage to the gate, the MOS transistor forms a channel that is a flow channel of majority carriers between the drain and the source to allow a current to flow. The MOS transistor 105 in the figure is formed in the same conductivity type as that of the source region 122 and the drain region 121, and a channel is formed even in a state where no voltage is applied to the gate 132. By application of a gate voltage that is positive with respect to the source region 122 to the gate 132 in this state, an inversion layer can be formed in the p-type well region below the channel region 123. Here, the inversion layer is a region where a large amount of conduction electrons are generated in the p-type well region. The inversion layer is formed, whereby a channel is also formed in the well region, and a large current can flow.

However, due to boron diffused from the element isolation region 124, it becomes difficult for an inversion layer to be formed in the channel region 123 in the vicinity of the element isolation region 124, and an effective channel width becomes narrower than a width of the channel region 123. For this reason, the conduction electrons that are carriers in the channel region 123 are concentrated and flow in the central portion of the channel region 123, and current density in the central portion of the channel region 123 is increased. In this region where the current density is increased, when capture of the conduction electrons and emission of the captured electrons occur, a flow of the current is hindered and noise characteristics are degraded.

Thus, in the MOS transistor 105, the protruding portion 221 of the drain region 121 is formed in the region where the channel region 123 is adjacent to the element isolation region 124. As a result, the channel length in the vicinity of the element isolation region 124 is shortened. A channel resistance in the vicinity of the element isolation region 124 can be lowered, and the current can be dispersed and the current concentration can be reduced in the central portion of the channel region 123.

[Current Density in Channel Region]

Figure 8:
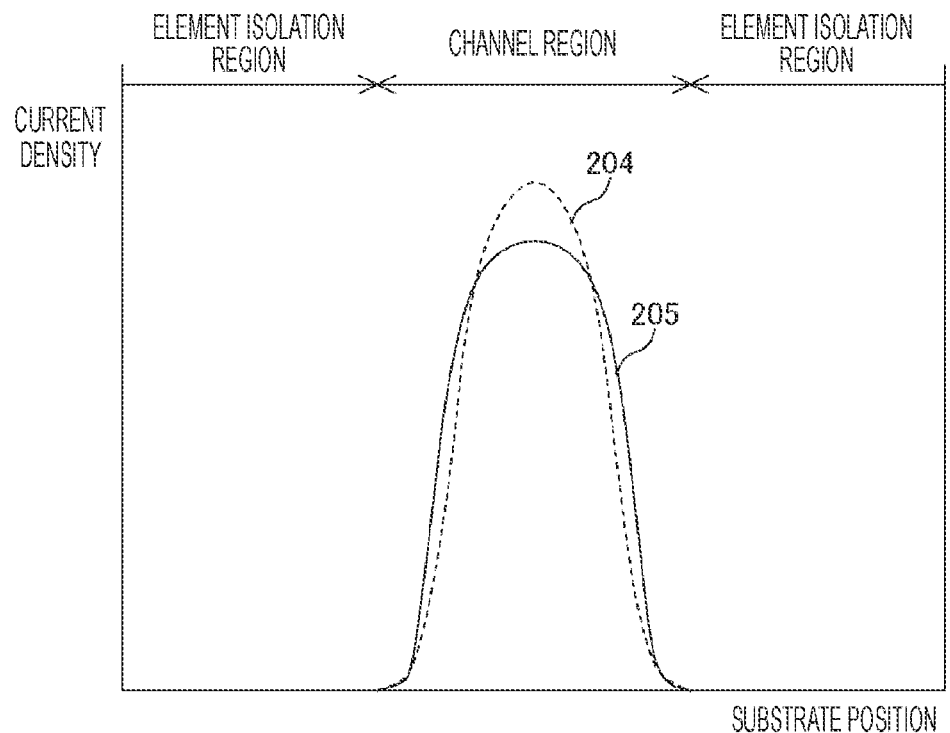
FIG. 8 is a diagram illustrating an example of current density in a channel region according to the embodiment of the present disclosure.

FIG. 8 is a diagram illustrating an example of the current density in the channel region according to the embodiment of the present disclosure. The figure illustrates the current density in a cross section of the channel region 123. A graph 204 in the figure is a graph illustrating the current density in a case where the protruding portion 221 of the drain region 121 is not formed. On the other hand, a graph 205 is a graph illustrating the current density in a case where the protruding portion 221 of the drain region 121 is formed. As described above, the protruding portion 221 of the drain region 121 is formed, whereby the current is dispersed, and the current density in the central portion of the channel region 123 can be lowered.

[Length of Protruding Portion]

Figure 9:
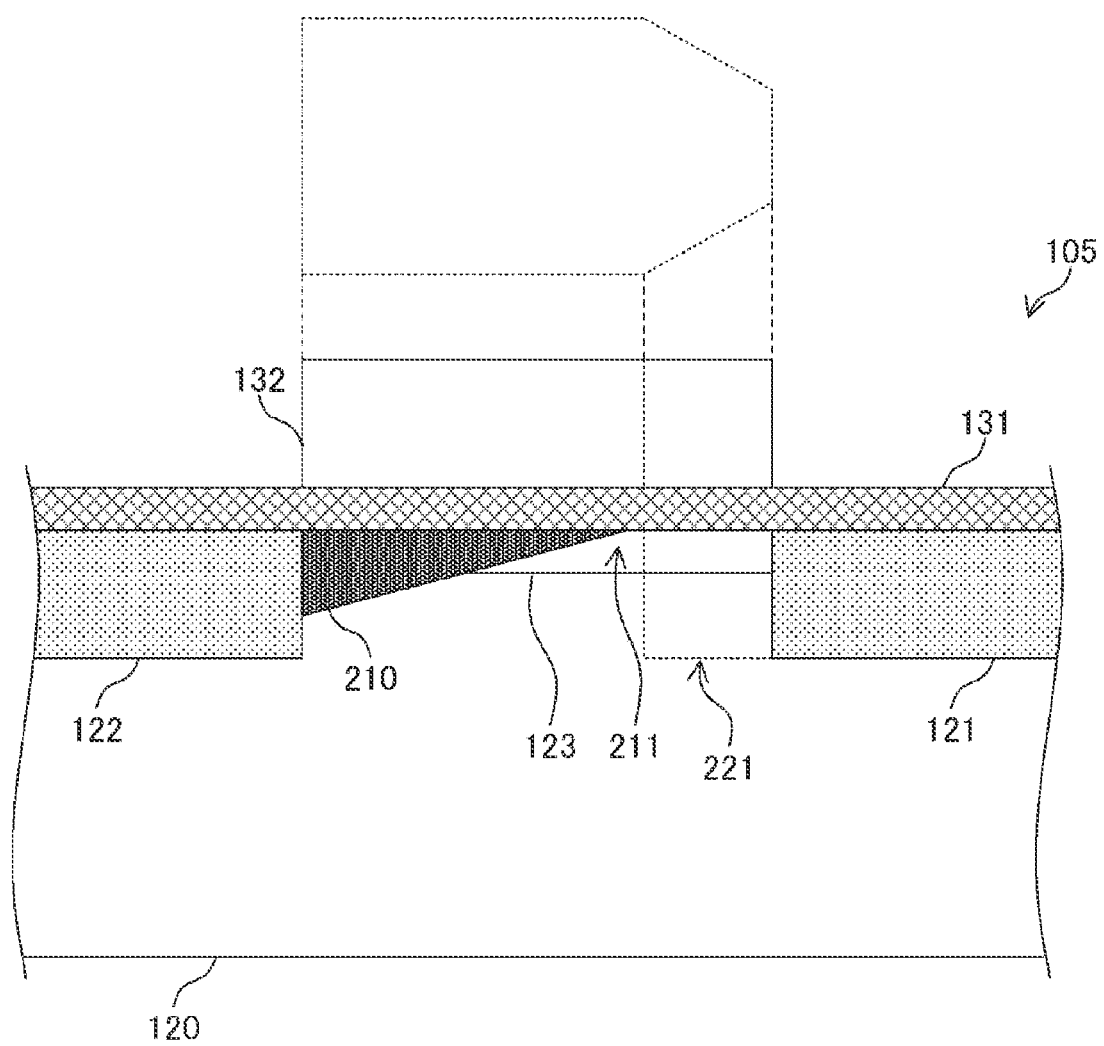
FIG. 9 is a diagram illustrating an example of a current in the channel region according to the embodiment of the present disclosure.

FIG. 9 is a diagram illustrating an example of the current in the channel region according to the embodiment of the present disclosure. The figure illustrates a relationship between a channel formed in the channel region 123 and the length of the protruding portion 221. By application of the gate voltage to the gate 132 as described above, the inversion layer is formed and a channel 210 is formed. In a case where a drain voltage is low, the channel 210 has a shape connected from the source region 122 to the drain region 121. In this state, a drain current flows through the channel 210. The MOS transistor 105 performs a linear operation in which the drain current increases depending on the drain voltage.

However, when the drain voltage is further increased, a depletion layer is generated in the vicinity of the drain region 121, and the channel 210 in the vicinity of the drain region 121 disappears. This state is referred to as pinch-off, and an end portion of the channel is referred to as a pinch-off point (in the figure, a pinch-off point 211). Between the pinch-off point 211 and the drain region 121, the current diffuses and flows from the surface of the semiconductor substrate 120 to the inside. The drain current depending on the gate voltage flows through the MOS transistor 105, and the MOS transistor 105 performs a constant current operation in which the drain current does not depend on the drain voltage.

When the MOS transistor 105 is caused to perform the constant current operation, it is preferable that the protruding portion 221 of the drain region 121 has a shape not to protrude beyond the pinch-off point 211 to the channel region 123. This is because it is possible to prevent the effective channel region 123 from being shortened by not forming the protruding portion 221 in this region since the region from the source region 122 to the pinch-off point 211 is a region where the channel is formed.

[Modification]

In the MOS transistor 105 described above, two protruding portions 221 are arranged; however, a configuration may be adopted in which one protruding portion 221 is arranged.

Figure 10:
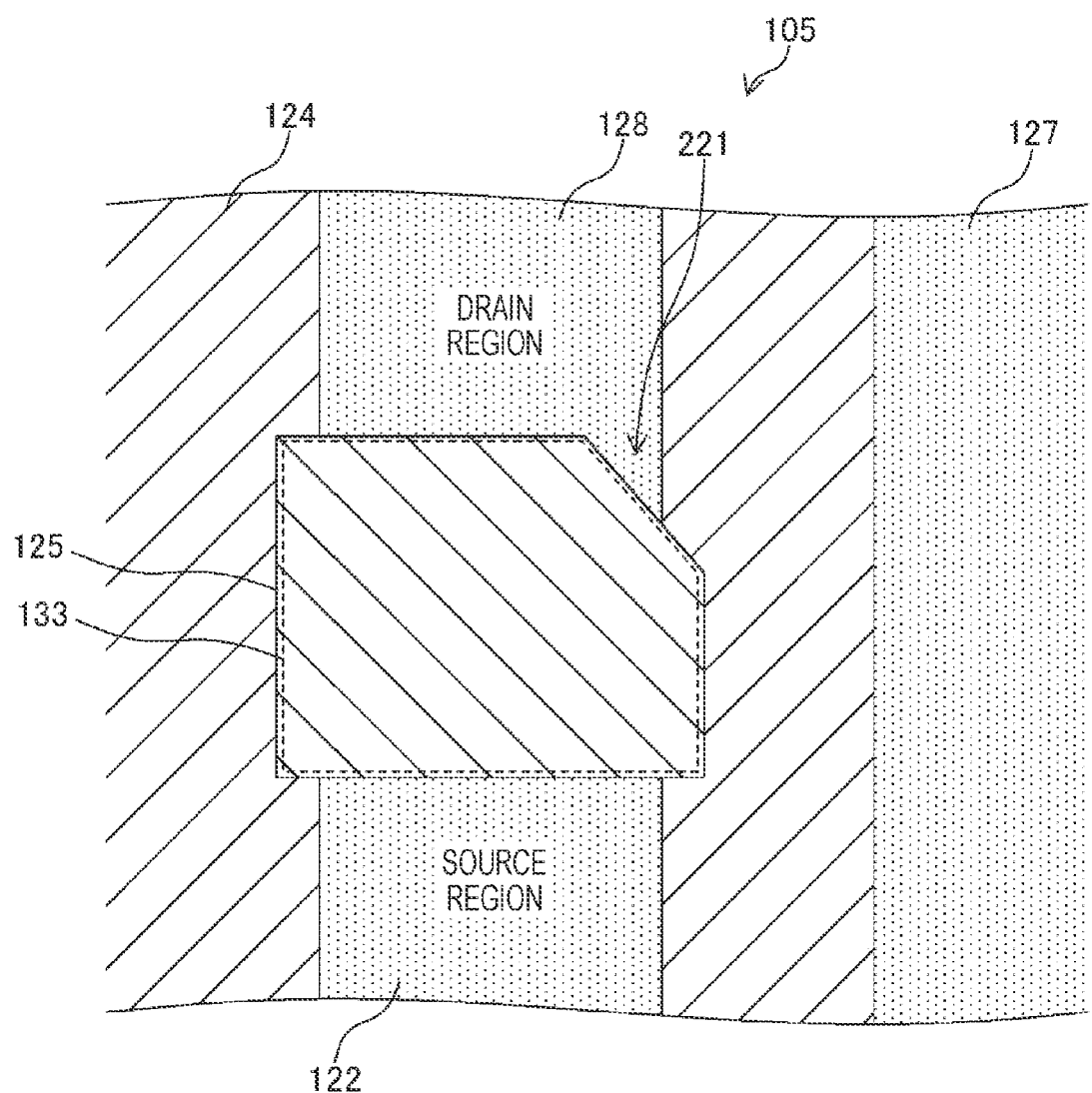
FIG. 10 is a plan view illustrating a transistor configuration example according to a modification of the embodiment of the present disclosure.

FIG. 10 is a plan view illustrating a transistor configuration example according to a modification of the embodiment of the present disclosure. The MOS transistor 105 in the figure is different from the MOS transistor 105 described in FIG. 4 in the following points. The MOS transistor 105 in the figure includes a gate 133 instead of the gate 132, a channel region 125 instead of the channel region 123, and a drain region 128 instead of the drain region 121.

In the MOS transistor 105 of the figure, one protruding portion 221 is formed in the vicinity of the boundary with the element isolation region 124 at the boundary between the channel region 125 and the drain region 128. Note that, the gate 133 has substantially the same shape as the channel region 125. The current concentration can be relaxed in the vicinity of the boundary with the element isolation region 124 on a side where the protruding portion 221 is formed.

As described above, in the semiconductor element of the embodiment of the present disclosure, the interface between the channel region 123 and the drain region 121 has a shape protruding in the direction of the source region 122 in the vicinity of the element isolation region 124. As a result, it is possible to reduce the current concentration in the central portion of the channel region 123 and prevent an increase in noise due to the current concentration.

<2. Method of Manufacturing Semiconductor Element>

A method will be described of manufacturing the semiconductor element described above.

[Method of Manufacturing Semiconductor Element]

Figure 11A:
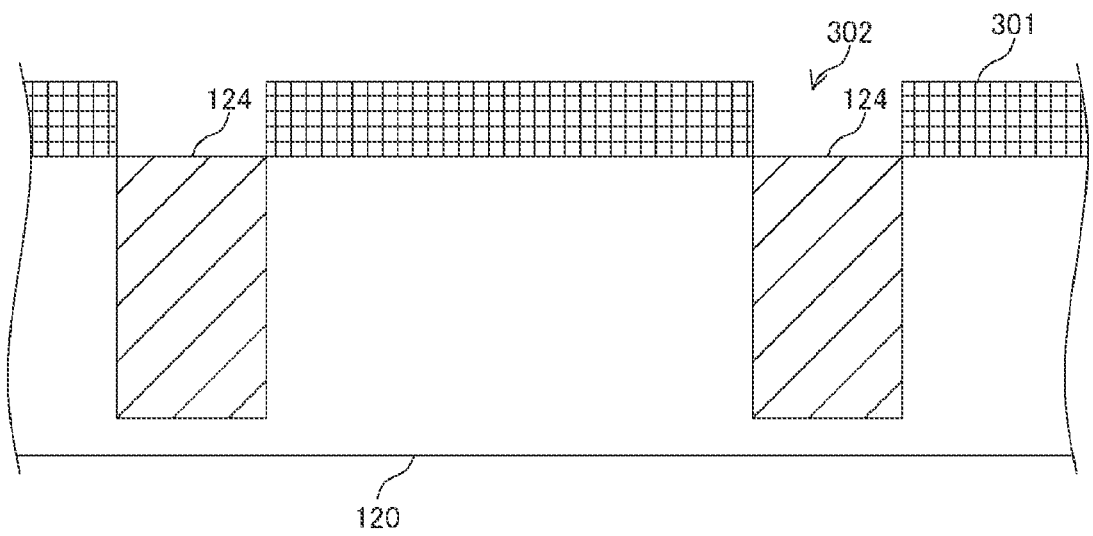
FIGS. 11A, 11B, and 11C are diagrams illustrating an example of a method of manufacturing a semiconductor element according to the embodiment of the present disclosure.

FIGS. 11A, 11B, 11C, 12A, and 12B are diagrams illustrating an example of a method of manufacturing a semiconductor element according to the embodiment of the present disclosure. First, a well region is formed on the semiconductor substrate 120. Next, a resist 301 including an opening 302 at a position where the element isolation region 124 is formed is arranged on the surface of the semiconductor substrate 120. Ion implantation of boron is performed with the resist 301 as a mask, to form the element isolation region 124 (FIG. 11A). This step corresponds to an element isolation region forming step.

Figure 11B:
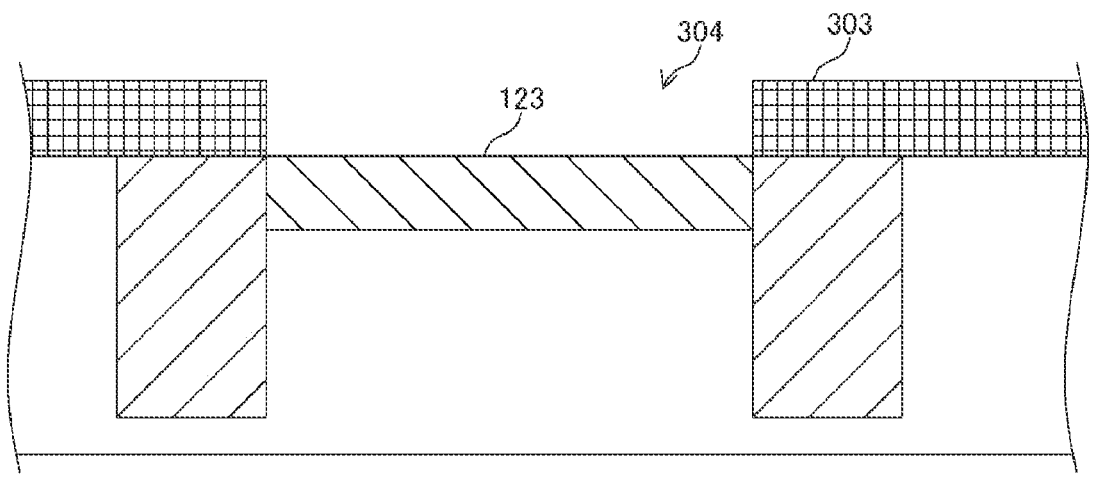

The resist 301 is removed, and a mask 303 including an opening 304 at a position where the MOS transistor 105 is formed is arranged on the surface of the semiconductor substrate 120. Next, ion implantation of phosphorus is performed to form the channel region 123 (FIG. 11B). This step corresponds to a channel forming step.

The resist 303 is removed to form the n-type semiconductor region 126 and the p-type semiconductor region 127 of the photoelectric conversion unit 101. This can be performed by ion implantation. Next, the insulating film 131 is formed on the surface of the semiconductor substrate 120. This can be performed by thermal oxidation (c in FIG. 11).

Next, the gate 132 is formed on the insulating film 131. This can be formed by forming a polycrystalline silicon film by chemical vapor deposition (CVD) and performing etching. At this time, the gate 132 is formed in a shape in which a portion of the protruding portion 221 described in FIG. 4 is deleted. This step corresponds to a gate forming step.

Figure 12A:
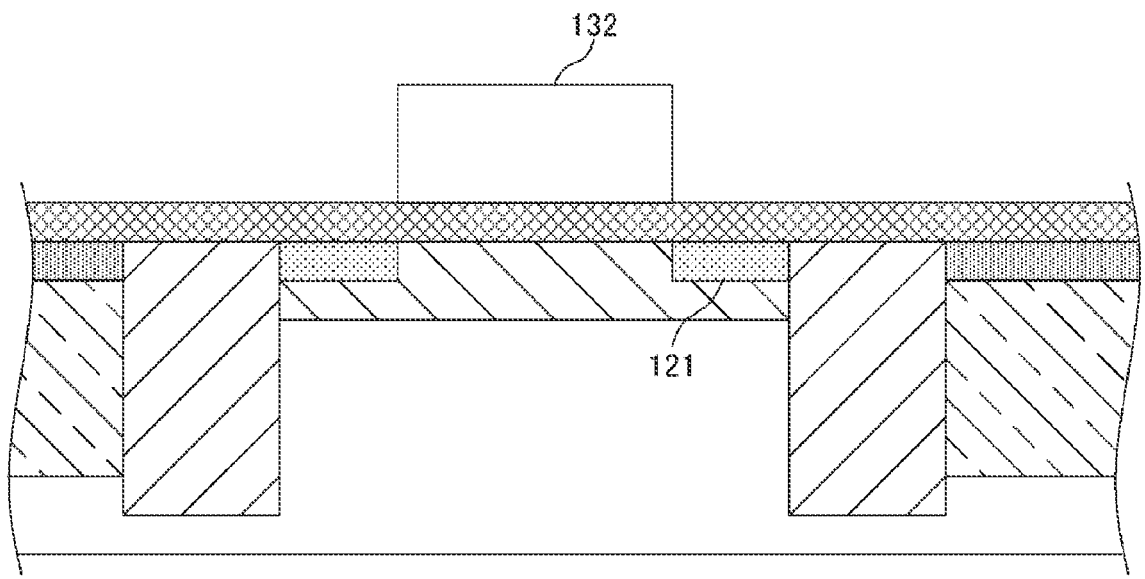
FIGS. 12A and 12B are diagrams illustrating the example of the method of manufacturing the semiconductor element according to the embodiment of the present disclosure.
Figure 12B:
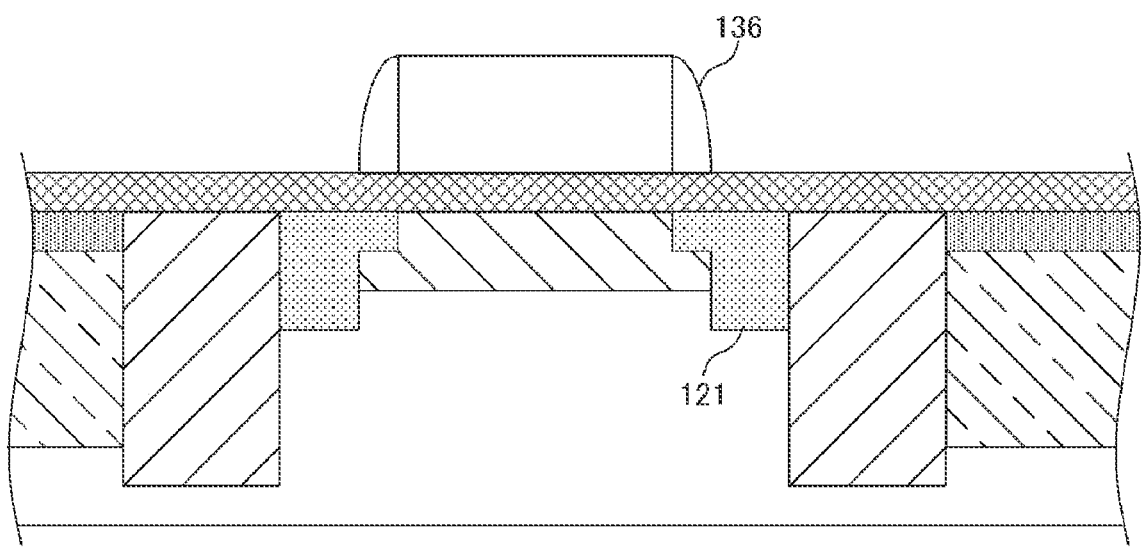

Next, ion implantation of phosphorus is performed with the gate 132 as a mask, to form the shallow drain region 121 and the shallow source region 122 (not illustrated) (FIG. 12A). Next, a spacer 136 is formed on a side surface of the gate 132. This can be formed by forming a SiO2 film by CVD or the like and then performing etch back. Next, ion implantation of phosphorus is performed again with the gate 132 and the spacer 136 as masks. As a result, the drain region 121 and the source region 122 (not illustrated) are formed (FIG. 12B). At this time, the protruding portion 221 is formed at the interface between the channel region 123 and the drain region 121. As described above, the MOS transistor 105 having a lightly doped drain (LDD) structure can be formed by forming the spacer 136 on the gate 132 and performing ion implantation twice. This step corresponds to a source and drain forming step.

The MOS transistor 105 can be manufactured by the above steps. By performing ion implantation with the gate 132 as a mask, the source region 122 and the drain region 121 can be formed by self-alignment, and the method of manufacturing the MOS transistor 105 can be simplified.

[Another Method of Manufacturing Semiconductor Element]

Figure 11C:
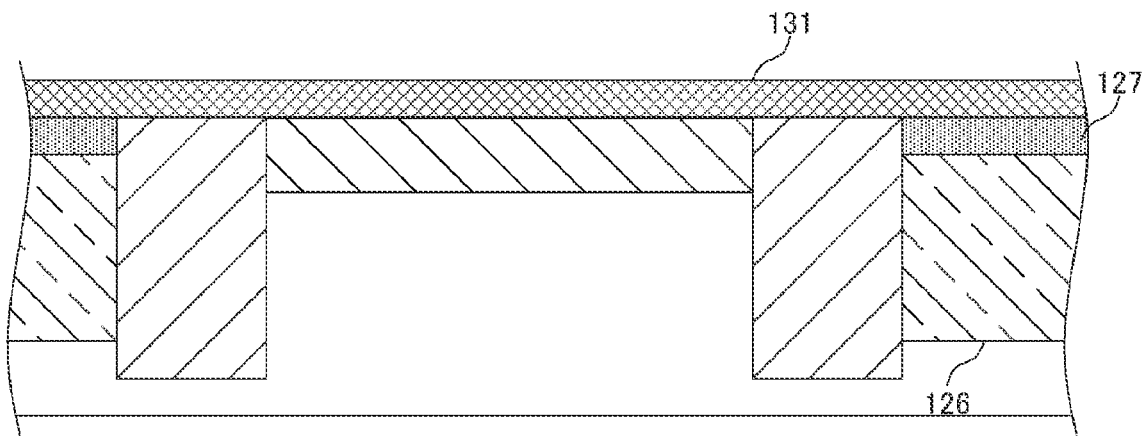
Figure 13A:
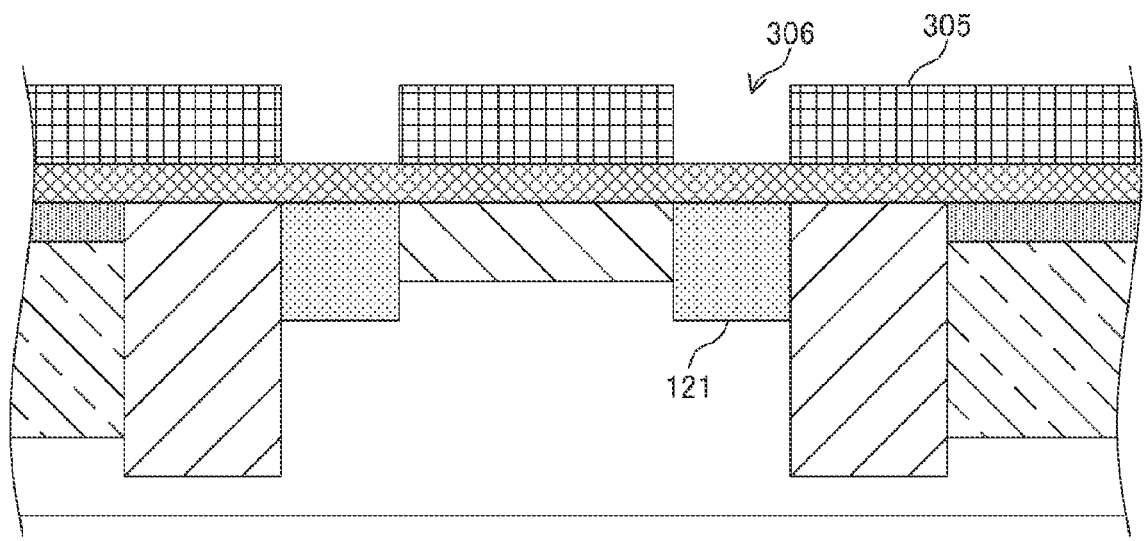
FIGS. 13A and 13B are diagrams illustrating another example of the method of manufacturing the semiconductor element according to the embodiment of the present disclosure.
Figure 13B:
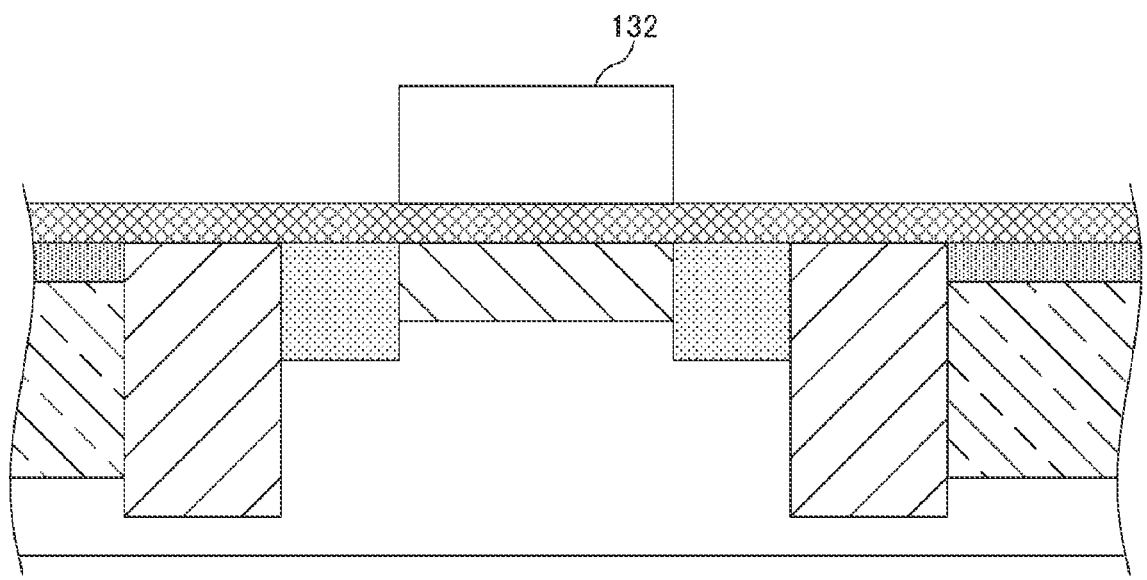

FIGS. 13A and 13B are diagrams illustrating another example of the method of manufacturing the semiconductor element according to the embodiment of the present disclosure. After the insulating film 131 described in FIG. 11C is formed, a resist 305 including an opening 306 is arranged at a position where the source region 122 and the drain region 121 are formed. At this time, the resist 305 is formed in a shape in which a portion of the protruding portion 221 is deleted. Next, ion implantation is performed with the resist 305 as a mask, to form the source region 122 and the drain region 121. At this time, the protruding portion 221 is formed at the interface between the channel region 123 and the drain region 121 (FIG. 13A). This step corresponds to a source and drain forming step.

The resist 305 is removed to form the gate 132 on the insulating film 131 (FIG. 13B). This step corresponds to a gate forming step. The MOS transistor 105 can also be manufactured by the above steps.

By the manufacturing method described above, the MOS transistor 105 can be manufactured including the channel region 123 having a shape in which the channel length is shortened in the vicinity of the element isolation region 124.

Lastly, the description of each of the embodiments described above is an example of the present disclosure, and the present disclosure is not limited to the embodiments described above. For this reason, it goes without saying that various changes other than the embodiments described above can be made depending on the design and the like as long as they do not deviate from the technical idea according to the present disclosure.

Note that, the present technology can also be configured as described below.

(1) A semiconductor element including:
an element isolation region formed on a semiconductor substrate;
a source region;
a drain region;
a gate arranged on a surface of the semiconductor substrate between the source region and the drain region with an insulating film interposed between the gate and the semiconductor substrate; and
a channel region that is arranged directly below the gate and between the source region and the drain region and is arranged adjacent to the element isolation region, and has a shape in which a channel length that is a distance between the drain region and the source region is shortened in the vicinity of the element isolation region.

(2) The semiconductor element according to (1), in which the channel region has a shape in which an interface with the drain region protrudes in a direction of the source region, in the vicinity of the element isolation region.

(3) The semiconductor element according to (2), in which, in the gate, an end face in the vicinity of the drain has a shape substantially identical to a shape of the interface between the channel region and the drain region.

(4) The semiconductor element according to (2), in which, in the channel region, an interface with the source region has a shape of a plane perpendicular to a direction of the drain region.

(5) The semiconductor element according to (2) in which the drain region is formed by being doped with an impurity with the gate as a mask, the gate having a shape in which a boundary with the drain region protrudes in the direction of the source region, in the vicinity of the element isolation region.

(6) The semiconductor element according to (2), in which the drain region is formed by being doped with an impurity with a resist as a mask, the resist having a shape in which a boundary with the drain region protrudes in the direction of the source region, in the vicinity of the element isolation region.

(7) The semiconductor element according to any of (1) to (6), in which the element isolation region includes a semiconductor region of a conductivity type different from a conductivity type of the channel region.

(8) The semiconductor element according to any of (1) to (7), in which the channel region includes a semiconductor region of a conductivity type identical to a conductivity type of the source region and the drain region.

(9) The semiconductor element according to any of (1) to (8), in which the drain region is formed by being doped with any of phosphorus, arsenic, antimony, indium or germanium, as an impurity.

(10) A method of manufacturing a semiconductor element, including:
an element isolation region forming step of forming an element isolation region formed on a semiconductor substrate;
a source and drain forming step of forming a source region and a drain region;
a gate forming step of forming a gate arranged on a surface of the semiconductor substrate between the source region and the drain region with an insulating film interposed between the gate and the semiconductor substrate; and
a channel forming step of forming a channel region that is arranged directly below the gate and between the source region and the drain region and is arranged adjacent to the element isolation region, and has a shape in which an interface with the drain region protrudes in a direction of the source region, in the vicinity of the element isolation region.

REFERENCE SIGNS LIST

105 MOS transistor
120 Semiconductor substrate
121, 128 Drain region
122 Source region
123, 125 Channel region
124 Element isolation region
131 Insulating film
132, 133 Gate
210 Channel
211 Pinch-off point
221 Protruding portion
305 Resist

The invention claimed is:

1. A semiconductor element, comprising:
an element isolation region on a semiconductor substrate;
a source region;
a drain region;
a gate on a surface of the semiconductor substrate between the source region and the drain region with an insulating film interposed between the gate and the semiconductor substrate; and
a channel region directly below the gate and between the source region and the drain region, wherein
the channel region is adjacent to the element isolation region,
the channel region has a shape in which a channel length that is a distance between the drain region and the source region is shortened in a vicinity of the element isolation region,
the channel region has the shape in which an interface with the drain region protrudes in a direction of the source region, in the vicinity of the element isolation region.

2. The semiconductor element according to claim 1, wherein, in the gate, an end face in a vicinity of the drain has a shape substantially identical to the shape of the interface between the channel region and the drain region.

3. The semiconductor element according to claim 1, wherein, in the channel region, an interface with the source region has a shape of a plane perpendicular to a direction of the drain region.

4. The semiconductor element according to claim 1, wherein
the drain region is doped with an impurity with the gate as a mask, and
the gate has a shape in which a boundary with the drain region protrudes in the direction of the source region, in the vicinity of the element isolation region.

5. The semiconductor element according to claim 1, wherein
the drain region is doped with an impurity with a resist as a mask, and
the resist has a shape in which a boundary with the drain region protrudes in the direction of the source region, in the vicinity of the element isolation region.

6. The semiconductor element according to claim 1, wherein the element isolation region includes a semiconductor region of a conductivity type different from a conductivity type of the channel region.

7. The semiconductor element according to claim 1, wherein the channel region includes a semiconductor region of a conductivity type identical to a conductivity type of the source region and the drain region.

8. The semiconductor element according to claim 1, wherein the drain region is doped with one of phosphorus, arsenic, antimony, indium, or germanium, as an impurity.

9. A method of manufacturing a semiconductor element, comprising:
forming stop of forming an element isolation region formed on a semiconductor substrate;
forming a source region and a drain region on the semiconductor substrate;
forming a gate arranged on a surface of the semiconductor substrate between the source region and the drain region with an insulating film interposed between the gate and the semiconductor substrate; and
forming a channel region that is arranged directly below the gate and between the source region and the drain region, wherein
the channel region is arranged adjacent to the element isolation region,
the channel region has a shape in which an interface with the drain region protrudes in a direction of the source region, in a vicinity of the element isolation region.

* * * * *